United States Patent
Nakamura et al.

(10) Patent No.: US 8,673,457 B2
(45) Date of Patent: Mar. 18, 2014

(54) ORGANIC ELECTROLUMINESCENCE DEVICE AND LIGHT EMITTING APPARATUS

(75) Inventors: Shinichi Nakamura, Tokyo (JP); Seishi Miura, Sagamihara (JP)

(73) Assignee: Canon Kabushiki Kaisha, Tokyo (JP)

( * ) Notice: Subject to any disclaimer, the term of this patent is extended or adjusted under 35 U.S.C. 154(b) by 1807 days.

(21) Appl. No.: 11/681,273

(22) Filed: Mar. 2, 2007

(65) Prior Publication Data

US 2007/0231599 A1    Oct. 4, 2007

(30) Foreign Application Priority Data

Mar. 31, 2006    (JP) ................................. 2006-097178

(51) Int. Cl.
*B32B 19/00*    (2006.01)
*B32B 9/00*    (2006.01)
*B32B 9/04*    (2006.01)

(52) U.S. Cl.
USPC .............. 428/690; 257/E51.041; 257/E51.05; 313/504; 313/506; 428/704; 428/917

(58) Field of Classification Search
USPC .................. 428/690, 917, 704; 313/504, 506; 257/E51.041, E51.05
See application file for complete search history.

(56) References Cited

U.S. PATENT DOCUMENTS

| | | | |
|---|---|---|---|
| 5,739,635 A | 4/1998 | Wakimoto | 313/504 |
| 6,013,384 A | 1/2000 | Kido et al. | 428/690 |
| 6,838,818 B2 | 1/2005 | Furugori et al. | 313/504 |
| 6,929,873 B2 | 8/2005 | Tsuboyama et al. | 428/690 |
| 7,163,831 B2 | 1/2007 | Hasegawa et al. | 438/22 |
| 7,166,958 B2 | 1/2007 | Furugori et al. | 313/504 |
| 2003/0072967 A1* | 4/2003 | Kido et al. | 428/690 |
| 2004/0235209 A1* | 11/2004 | Hasegawa et al. | 438/21 |
| 2007/0042517 A1 | 2/2007 | Haseqawa et al. | 438/22 |

FOREIGN PATENT DOCUMENTS

| | | |
|---|---|---|
| JP | 09-017574 | 1/1997 |
| JP | 10-270172 | 10/1998 |
| JP | 2004-095491 | 3/2004 |
| JP | 2005-510034 | 4/2005 |
| JP | 2005-293961 | 10/2005 |
| WO | WO2007/113984 | 10/2007 |

OTHER PUBLICATIONS

Johansson, N., et al., "Electronic Structure of Tris(8-hydroxyquinoline) Aluminum Thin Films in the Pristine and Reduced States", J. Chem. Phys., 111, 5, Aug. 1999.
U.S. Appl. No. 11/993,083, filed Dec. 19, 2007.

* cited by examiner

*Primary Examiner* — Bijan Ahvazi
(74) *Attorney, Agent, or Firm* — Fitzpatrick, Cella, Harper & Scinto

(57) ABSTRACT

There is provided an organic electroluminescence device including: a pair of electrodes formed of an anode and a cathode; and an organic compound layer provided between the pair of electrodes, in which: the organic compound layer contains a metal so that the metal partially forms a coordination bond with an organic compound; and a ratio of the number of metal atoms involved in the coordination to the total number of metal atoms in the layer is 0.11 or more to 0.42 or less. The organic electroluminescence device has excellent light emitting property that is not largely impaired even after the device is driven for a long time period.

11 Claims, 2 Drawing Sheets

US 8,673,457 B2

ORGANIC ELECTROLUMINESCENCE DEVICE AND LIGHT EMITTING APPARATUS

BACKGROUND OF THE INVENTION

1. Field of the Invention

The present invention relates to an organic electroluminescence device and a light emitting apparatus utilizing the device.

2. Description of the Related Art

An organic electroluminescence device is expected to be put into practical use as a next-generation display device because of its advantages over a liquid crystal display such as (1) a low power consumption, (2) a good view angle, (3) potential for becoming additionally thin, and (4) potential for enabling the utilization of a flexible substrate.

However, the organic electroluminescence device still involves a large number of problems to be solved before the device is put into practical use. Examples of the problems include low light emitting property, a short lifetime, and the difficulty of a process for turning the device into a thin film having a thickness at a level of several tens of nanometers. In particular, an improvement in property with which charge is injected from an electrode into an organic compound layer is indispensable for alleviating the low light emitting property and the short lifetime.

Doping the organic compound layer with, for example, an alkali metal, or an oxide, peroxide, or salt of the alkali metal is known to alleviate the low light emitting property and the short lifetime (Japanese Patent No. 3529543, Japanese Patent Application Laid-Open No. H10-270172, and National Publication No. 2005-510034 (of PCT application)). In addition, one can learn the coordination of an organic compound and an alkali metal with reference to Journal of chemical physics vol. 111, No. 5, 2157, 1999.

Although the low light emitting property has been alleviated to some extent by an improvement in charge injecting property, the problem concerning the lifetime is not sufficiently solved yet.

SUMMARY OF THE INVENTION

An object of the present invention is to provide an organic electroluminescence device which has excellent light emitting property that is not largely impaired even after the device is driven for a long time period, and a light emitting apparatus utilizing the device.

According to the present invention, there is provided an organic electroluminescence device including: a pair of electrodes formed of an anode and a cathode; and an organic compound layer provided between the pair of electrodes, in which: the organic compound layer contains a metal so that the metal partially forms a coordination bond with an organic compound; and a ratio of the number of metal atoms involved in the coordination to the total number of metal atoms in the layer is 0.11 or more to 0.42 or less.

According to the present invention, there can be provided an organic electroluminescence device which is excellent in light emitting property and lifetime and which has high productivity. In addition, there can be provided a light emitting apparatus that can be suitably used in the information display portion of a display by utilizing the device.

Further features of the present invention will become apparent from the following description of exemplary embodiments with reference to the attached drawings.

DESCRIPTION OF THE EMBODIMENTS

Figure 1A:
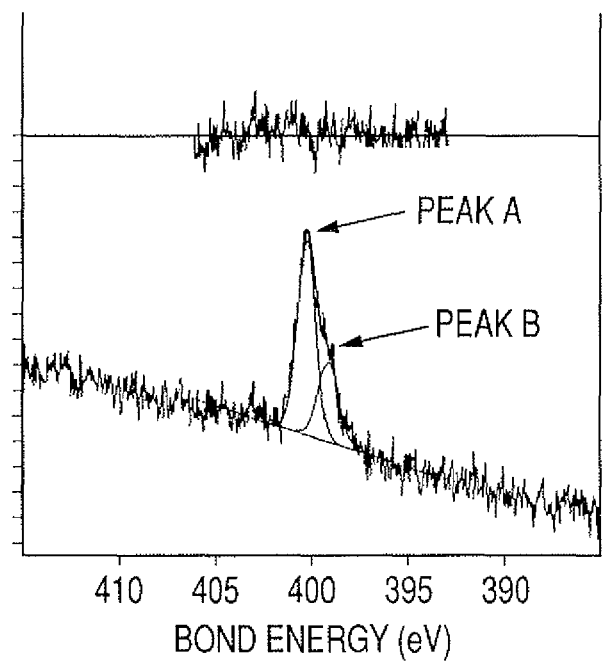
FIG. 1A is a representative example of the binding energy chart corresponding to an N1s orbital measured by X-ray photoelectron spectroscopy of a film obtained by the co-vapor-deposition of a metal cesium dispenser and a phenanthroline derivative.

Hereinafter, the present invention will be described in detail by taking the case where a metal is cesium as an example.

First, reference numerals in the figures will be described. Reference numeral 1 represents a substrate; 2, an anode; 3, a hole injecting layer; 4, a hole transporting layer; 5, a light emitting layer; 6, an electron transporting layer; 7, an electron injecting layer; 8, a metal-containing organic compound layer; and 9, a cathode.

Figure 1B:
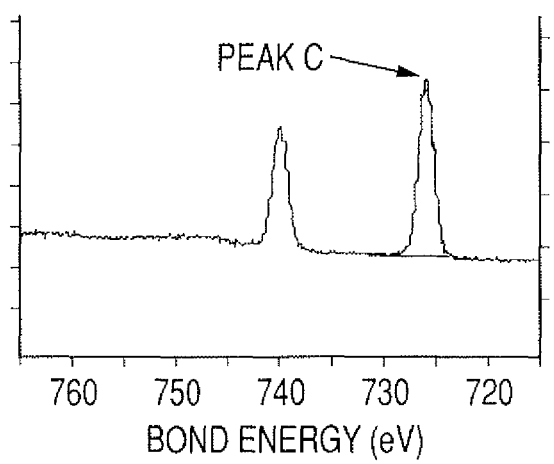
FIG. 1B is a representative example of the binding energy chart corresponding to a Cs3d5 orbital measured by X-ray photoelectron spectroscopy of the film obtained by the co-vapor-deposition of the metal cesium dispenser and the phenanthroline derivative.

FIG. 1A is a representative example of the binding energy chart corresponding to an N1s orbital measured by X-ray photoelectron spectroscopy of a film obtained by the co-vapor-deposition of a metal cesium dispenser and a phenanthroline derivative on a gold substrate. In addition, FIG. 1B is similarly a representative example of the binding energy chart corresponding to a Cs3d5 orbital measured by X-ray photoelectron spectroscopy of the film obtained by the co-vapor-deposition.

In FIG. 1A, two kinds of peaks, that is, a peak A and a peak B are observed. The peak A is the peak of a nitrogen atom not involved in coordination, and the peak B is the peak of a nitrogen atom coordinating with a cesium atom. In addition, the phenanthroline derivative is structured so that one cesium atom coordinates with two nitrogen atoms, so half of the number of the coordinating nitrogen atoms of the peak B corresponds to the number of cesium atoms involved in the coordination (coordinating with an organic compound). In FIG. 1B, the peak of a cesium atom involved in the coordination and the peak of a cesium atom not involved in the coordination are not clearly separated from each other, and the peaks appear as one peak C. Therefore, the total number of cesium atoms in the co-vapor-deposition film is calculated from the peak C of FIG. 1B.

In view of the foregoing, a ratio of the number of cesium atoms involved in the coordination to the total number of cesium atoms (coordinating cesium ratio) is represented by the following formula (I):

Coordinating cesium ratio=(the number of the nitrogen atoms of the peak B/2)/the number of the cesium atoms of the peak C (I).

FIGS. 1A and 1B show an example of the measurement of a co-vapor-deposition film formed on a gold substrate. A component of a deposited product does not change on an inert substrate. Therefore, the co-vapor-deposition film present in the device of the present invention is also assumed to be in conformance with the fact.

In addition, the formula (I) corresponds to the case where the metal is cesium and the organic compound has two nitrogen atoms involved in coordination. In the case where the organic compound has n nitrogen atoms involved in the coordination, a ratio of the number of metal atoms involved in the coordination to the total number of metal atoms (coordinating metal ratio) is represented by a general formula (II):

Coordinating metal ratio=(the number of coordinating nitrogen atoms/n)/the total number of metal atoms (II).

In addition, even in the case of an organic compound free of nitrogen, a coordinating metal ratio can be calculated by determining the number of the atoms of an element coordinating in a manner similar to that of nitrogen.

The inventors of the present invention have made extensive studies while paying attention to a coordinating metal ratio. As a result, the inventors have found that light emitting property and a lifetime can be improved by controlling the coordinating metal ratio. It has been confirmed that a coordinating metal ratio of less than 0.11 reduces luminous efficiency. This is probably because a conductivity is not improved when the number of coordinating metal atoms is small. It has been also confirmed that a coordinating metal ratio in excess of 0.42 deteriorates the lifetime. This is probably because the diffusion of the metal to any other organic layer is promoted when the number of coordinating metal atoms is excessively large. In addition, the coordinating metal ratio is preferably 0.22 or more to 0.42 or less in order that an effect of the present invention may be additionally significant.

In addition, a molar ratio of the metal to the organic compound can be obtained by calculating the number of moles of the organic compound from the total number of nitrogen atoms. The molar ratio of the metal to the organic compound is preferably 0.5 or more to 3.0 or less. A molar ratio of less than 0.5 reduces an effect intrinsic to metal doping shown in each of Japanese Patent No. 3529543, Japanese Patent Application Laid-Open No. H10-270172, and National Publication No. 2005-510034 (of PCT application) described above. A molar ratio in excess of 3.0 is apt to cause a detrimental effect such as a short circuit between electrodes.

The metal to be used in the present invention is not particularly limited as long as the metal coordinates with the organic compound; a metal having an ionization energy of 7 eV or less is preferable from the viewpoint of the ease with which the metal coordinates with the organic compound. Examples of such metal include Li, Na, K, Rb, Cs, Ca, Sr, Ba, Al, Sc, Y, Ti, Zr, and V. A metal having an ionization energy of 5 eV or less is additionally preferable, and examples of such metal include K, Rb, and Cs.

The organic electroluminescence device of the present invention is effective in each of a bottom emission type (BE type) structure in which emitted light is extracted from a substrate side and a top emission type (TE type) structure in which light is extracted from a side opposite to a substrate. The present invention will be described in more detail with reference to FIGS. 2 and 3.

Figure 2:
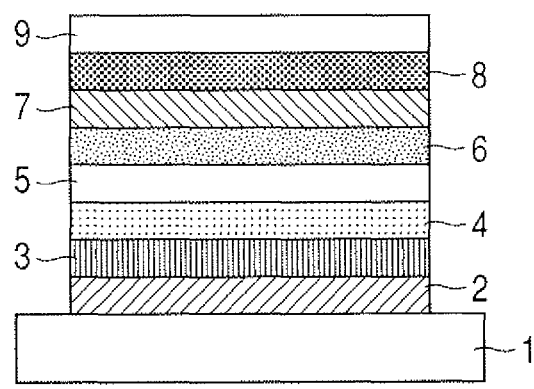
FIG. 2 is an example of a schematic sectional view of an organic electroluminescence device of the present invention.
Figure 3:
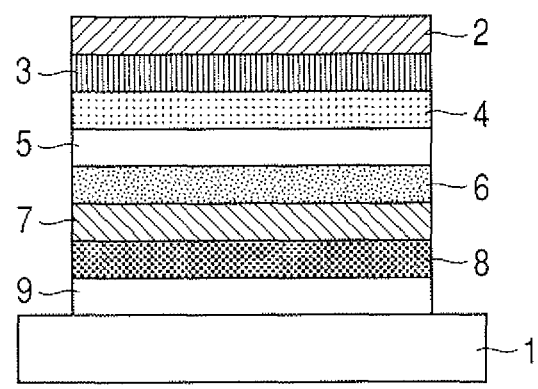
FIG. 3 is an example of a schematic sectional view of the organic electroluminescence device of the present invention.

FIGS. 2 and 3 are each an example of a schematic sectional view showing the organic electroluminescence device of the present invention. In FIG. 2, the anode 2 is placed on the substrate 1, and the hole injecting layer 3, the hole transporting layer 4, the light emitting layer 5, the electron transporting layer 6, the electron injecting layer 7, the metal-containing organic compound layer 8, and the cathode 9 are placed in the stated order on the resultant. The organic electroluminescence device of the present invention may be structured as shown in FIG. 3: the cathode 9 is placed on the substrate 1, and the metal-containing organic compound layer 8, the electron injecting layer 7, the electron transporting layer 6, the light emitting layer 5, the hole transporting layer 4, the hole injecting layer 3, and the anode 2 are placed in the stated order on the resultant. In addition, the metal-containing organic compound layer 8, which is positioned between the cathode 9 and the electron injecting layer 7 in each of the figures, may be positioned at an arbitrary site in the organic electroluminescence device. The constituent elements indispensable to the present invention are the metal-containing organic compound layer 8, the anode 2, the cathode 9, and the light emitting layer 5, and at least one layer of the hole injecting layer 3, the hole transporting layer 4, the electron transporting layer 6, and the electron injecting layer 7 can be removed for the simplification of a process for producing the device.

In addition, the metal-containing organic compound layer 8 is preferably in substantial electrical contact with the cathode 9 in order that the property with which charge is injected from an electrode into an organic compound layer may be improved. The term "substantial electrical contact" refers to the case where electron injecting property is improved even when another layer such as an organic compound layer, an inorganic compound layer, or a layer containing the mixture of organic and inorganic substances is provided between the cathode 9 and the metal-containing organic compound layer 8.

Next, organic compound layers to be used in the present invention will be described.

Examples of a material for the hole transporting layer include, but not limited to, low-molecular-weight compounds such as a triphenyldiamine derivative, an oxadiazole derivative, a polyphilyl derivative, and a stilbene derivative, and conjugate polymer compounds such as a poly(3,4-ethylenedioxythiophene) derivative, a polythienylene vinylene derivative, a polyphenylene vinylene derivative, and a polypyridine derivative. A low-molecular-weight compound is preferable because a vapor deposition process can be employed. The term "low-molecular-weight compound" as used in the present invention refers to a compound having a molecular weight of 3,000 or less. Preferable structures are shown below.

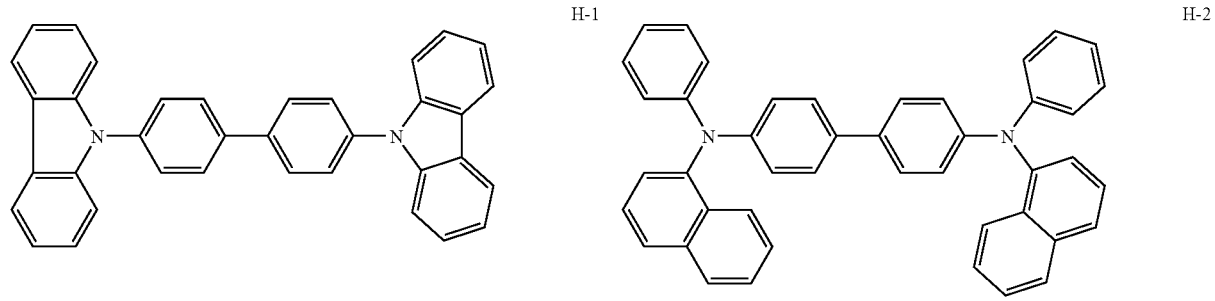

H-1  H-2

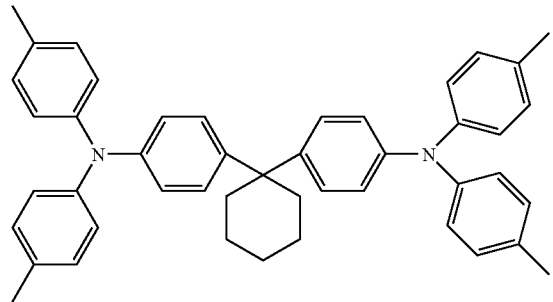
H-3
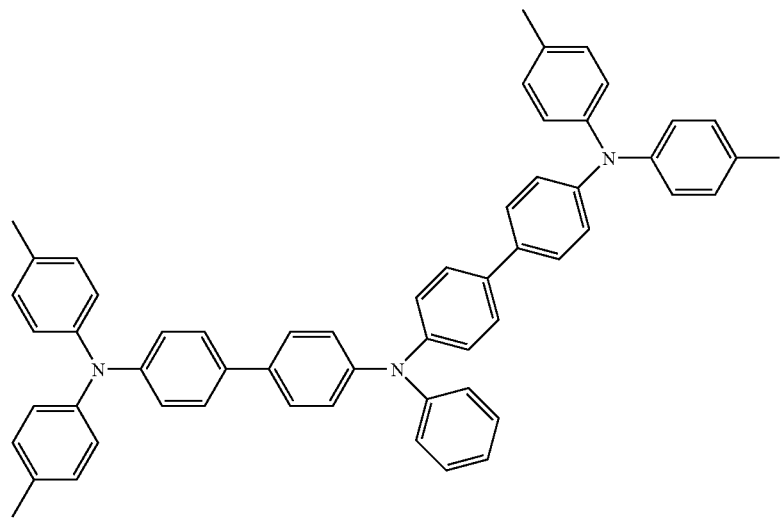
H-4
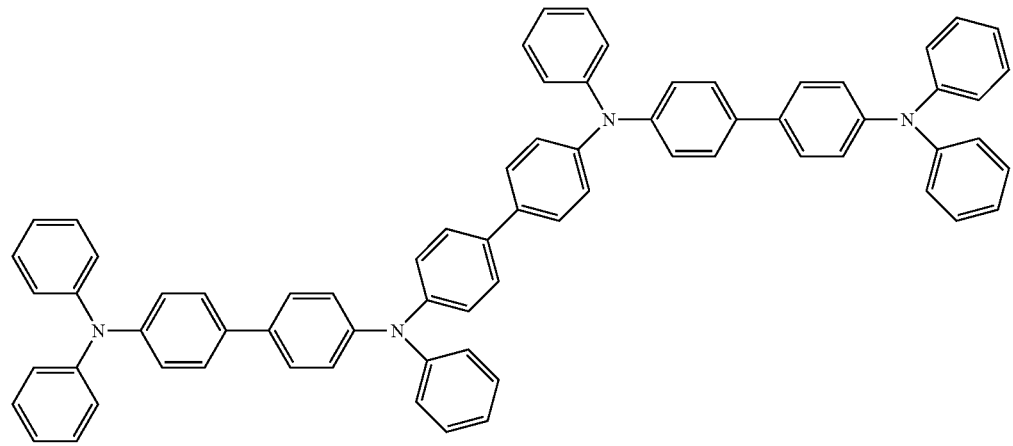
H-5

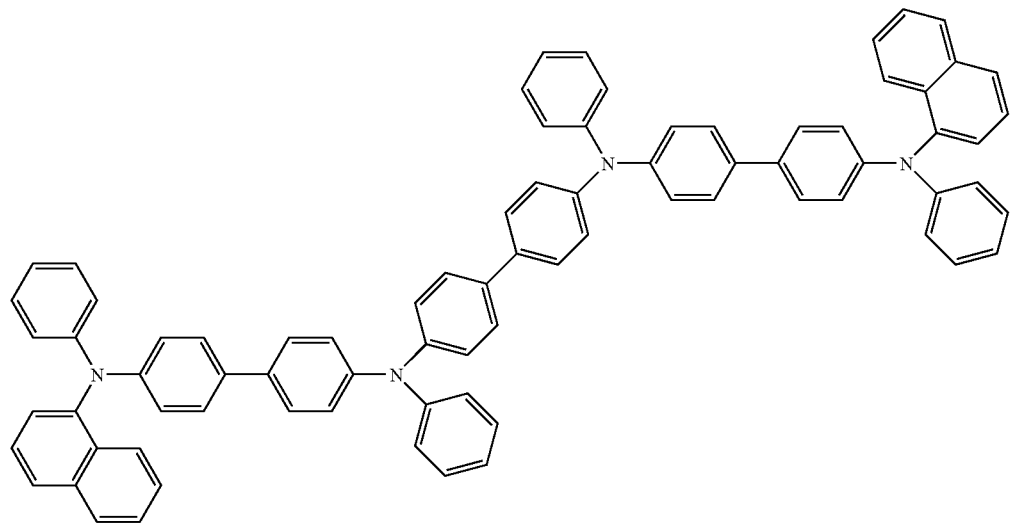
H-6
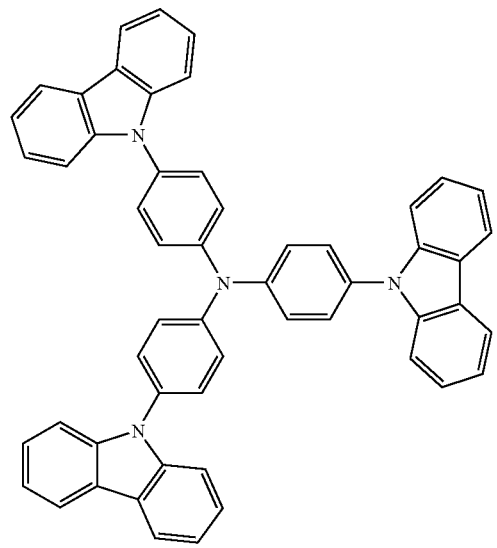
H-7
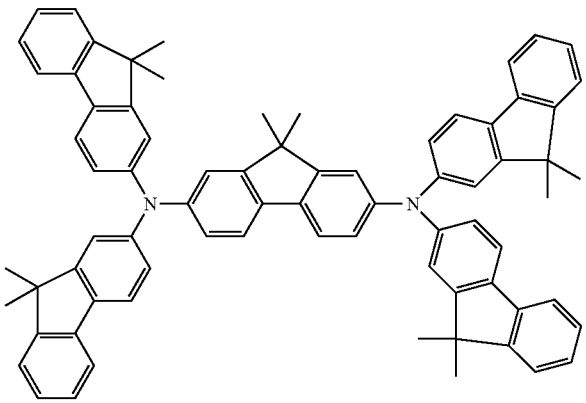
H-8
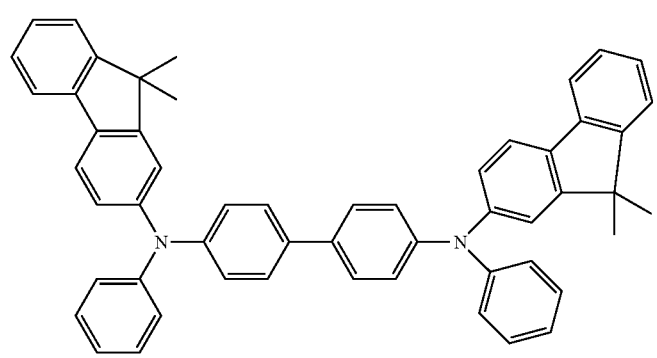
H-9

Examples of a material for the electron transporting layer include, but not limited to, an aluminum quinolinol derivative, a phenanthroline derivative, an oxadiazole derivative, a triazole derivative, a phenylquinoxaline derivative, and a silole derivative. A low-molecular-weight compound is preferable because a vapor deposition process can be employed. The phenanthroline derivative which is excellent in light emitting property is more preferable. Preferable structures are shown below.

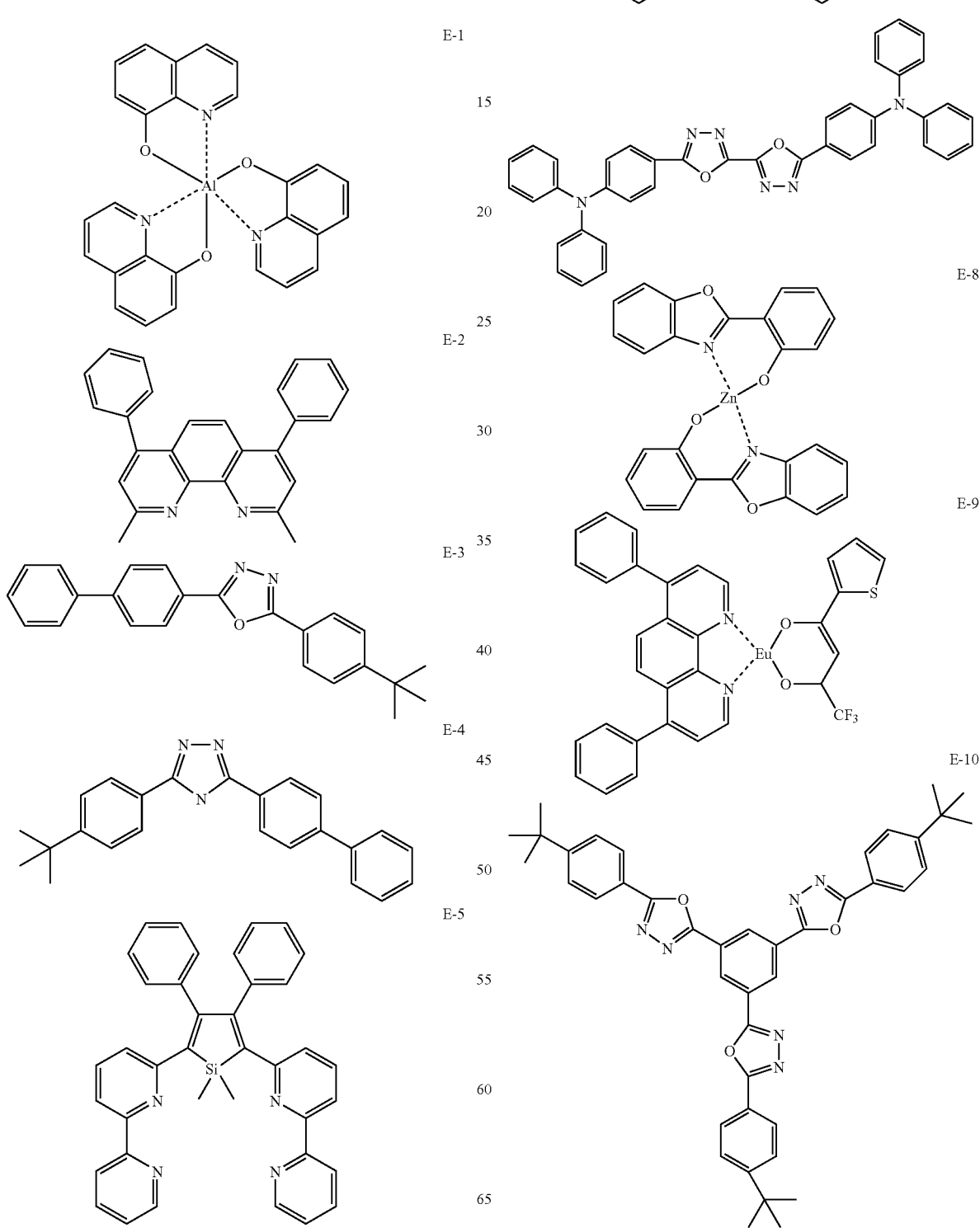

E-11
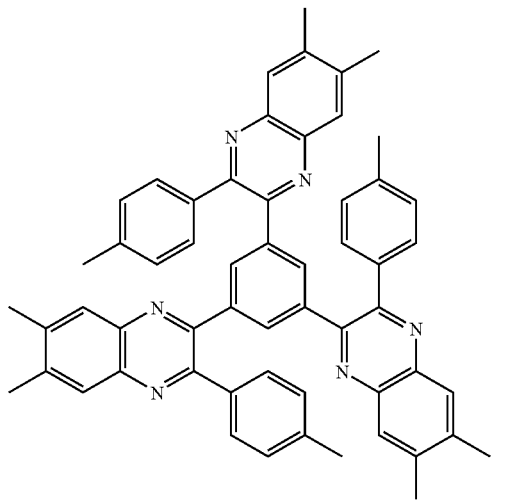

E-12
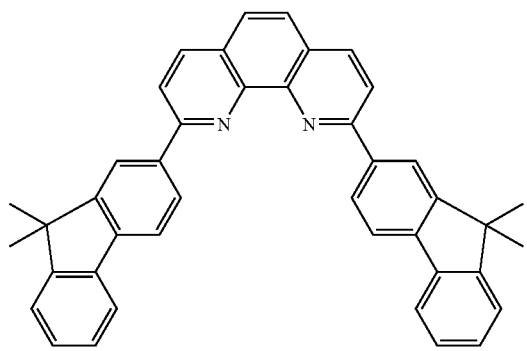

E-13
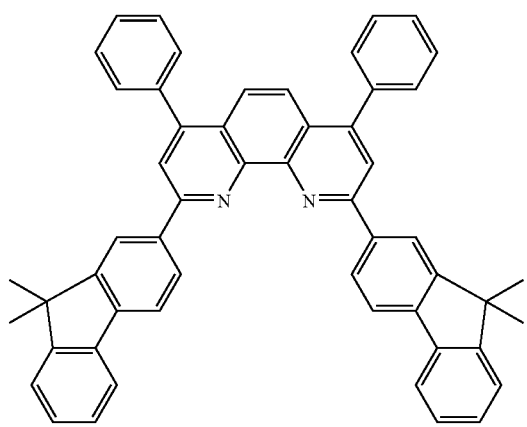

E-14
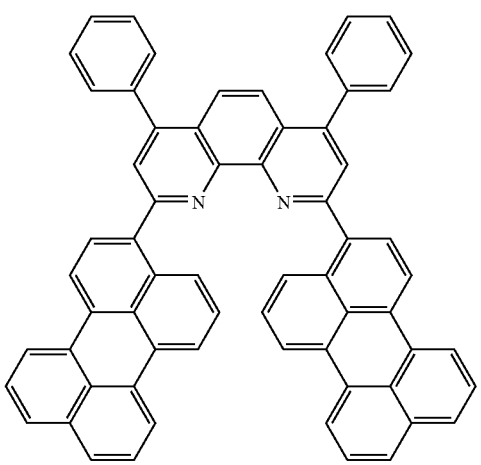

E-15
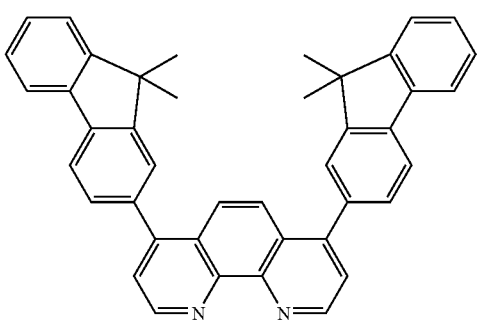

Examples of a material for the light emitting layer include, but not limited to, any one of the above-mentioned materials used in the hole transporting layer, any one of the above-mentioned materials used in the electron transporting layer, a triarylamine derivative, a stilbene derivative, a polyarylene derivative, an aromatic fused polycyclic compound, an aromatic heterocyclic compound, an aromatic fused heterocyclic compound, an oligo body or composite oligo body formed of at least one of those described above, an Al complex, an Mg complex, a zinc complex, an Ir complex, an Au complex, an Ru complex, an Re complex, and an Os complex. A low-molecular-weight compound is preferable because a vapor deposition process can be employed. In addition, a mixed layer obtained by doping the hole transporting layer or the electron transporting layer with one or more kinds of those light emitting materials may be used as the light emitting layer. Preferable structures are shown below.

A-1
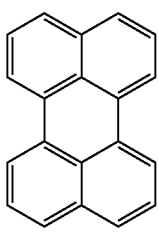

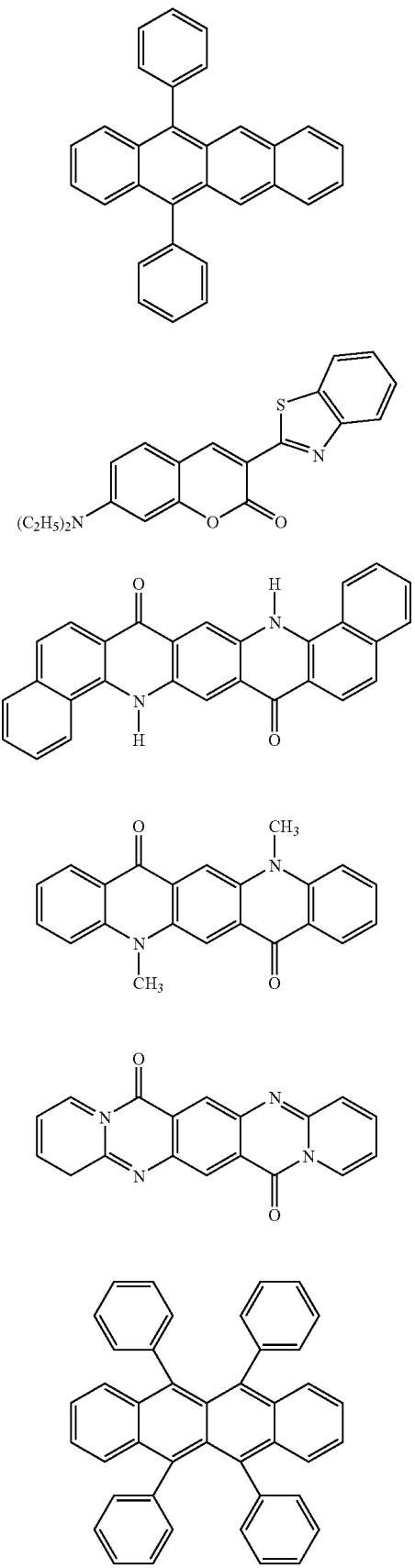
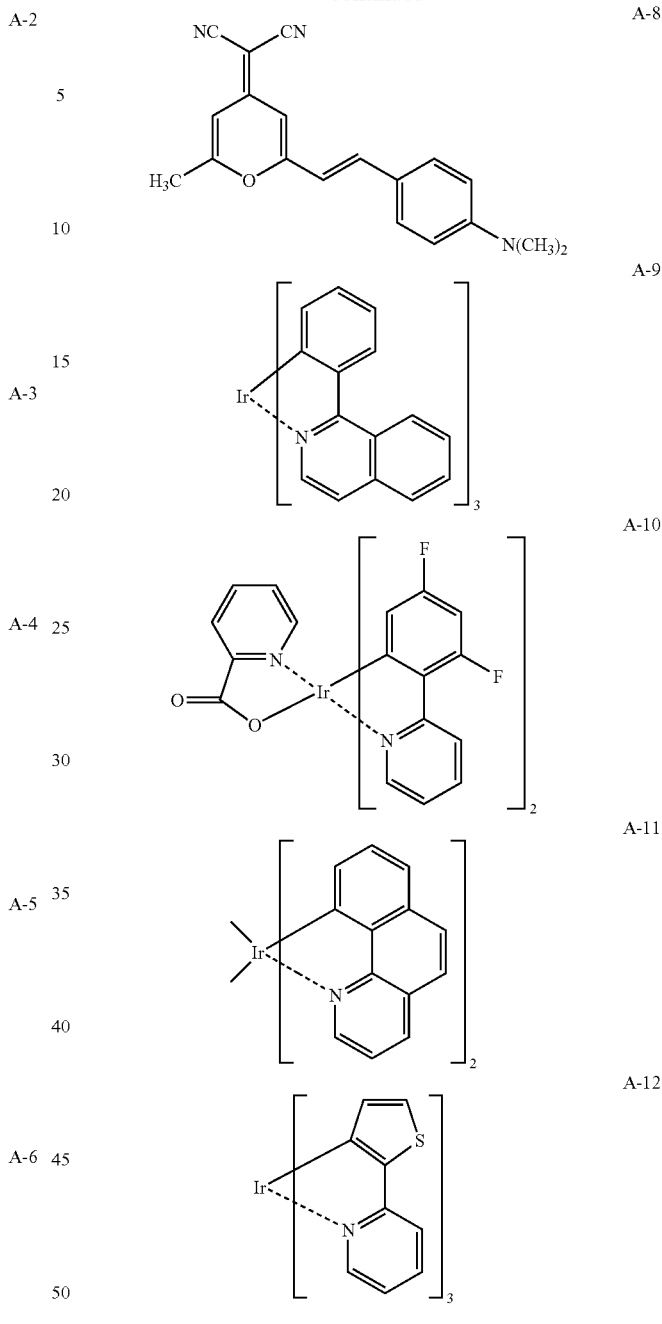

Examples of a suitable material for the anode to be used in the present invention include: metal materials such as Al, Cu, Ti, Au, Pt, Ag, Cr, Pd, Se, and Ir, and alloy materials of those metal materials; and inorganic materials such as polysilicon, silicide, indium tin oxide (ITO), indium tin zinc oxide (ITZO), indium zinc oxide (IZO), and $SnO_2$. For example, conductive polymers typified by highly doped polypyridine, highly doped polyacetylene, highly doped polyaniline, highly doped polypyrrole, and highly doped polythiophene, and conductive ink in which a carbon particle, a silver particle, or the like is dispersed are also suitable. In the case of the organic electroluminescence device shown in FIG. 2, a transparent electrode made of, for example, ITO, ITZO, or IZO having high transparency is preferable for a BE type, and a metal material such as Ag or Cr having a high reflectivity is preferable for a TE type. A laminated structure containing two or more of those materials such as an Al/ITO structure, an Ag/IZO structure, or an ITO/Al/ITO structure can also be used.

Examples of a material for the cathode to be used in the present invention include: metal materials such as Al, Mg, Ca, Cu, Ti, Au, Pt, Ag, Cr, Pd, Se, and Ir, and alloy materials of those metal materials; inorganic materials such as polysilicon, silicide, indium tin oxide (ITO), indium tin zinc oxide (ITZO), indium zinc oxide (IZO), and $SnO_2$; conductive polymers typified by highly doped polypyridine, highly doped polyacetylene, highly doped polyaniline, highly doped polypyrrole, and highly doped polythiophene; and conductive ink in which a carbon particle, a silver particle, or the like is dispersed. A laminated structure containing two or more of those materials such as an Ag/Mg structure, an Al/Mg structure, or an Ag/Mg/Ag structure can also be used. A transparent electrode made of, for example, ITO, ITZO, or IZO having high transparency is preferable in order that emitted light may be efficiently extracted.

The substrate to be used in the present invention is not particularly limited. Examples of a material that can be used in the substrate include: inorganic materials such as glass and quartz; photosensitive polymer compounds such as acrylic, vinyl-based, ester-based, imide-based, urethane-based, diazo-based, and cinnamoyl-based photosensitive polymer compounds; organic materials such as polyvinylidene fluoride, polyethylene terephthalate, and polyethylene; and organic/inorganic hybrid materials. A laminated structure containing two or more of those materials can also be used. In addition, an active device such as a TFT may be provided.

The metal-containing organic compound layer of the present invention is preferably produced by co-vapor-deposition according to a vacuum vapor deposition method. At this time, a metal having small ionization energy has so high reactivity that it is difficult to handle the metal. Accordingly, a metal compound capable of generating a metal may be used instead of a metal elementary substance. The use of, for example, a metal dispenser manufactured by SAES Getters, or a metal carbonate or a metal oxide is advantageous. In addition, a film formation rate is not particularly limited to the extent that a metal and an organic compound are stably deposited from the vapor. A film formation rate measured with, for example, a quartz resonator is in the range of 0.001 nm/sec or more to 1 nm/sec or less. A ratio of the film formation rate of the metal to the film formation rate of the organic compound (the film formation rate of the metal)/(the film formation rate of the organic compound), which is not particularly limited, is in the range of, for example, 0.1 or more to 10 or less. Examples of an approach to controlling a coordinating metal ratio include the control of an interaction between the organic compound and a metal element based on the selection of the structure of the organic compound and the metal element, and the control of each of a substrate temperature, a degree of vacuum, and the partial pressure of a gas in a chamber at the time of vapor deposition. For example, when the organic compound is a phenanthroline derivative, a useful metal is K, Rb, or Cs. In addition, such control that the substrate temperature falls within the range of 50° C. or higher to 150° C. or lower is effective, and such control that the degree of vacuum falls within the range of $1 \times 10^{-7}$ Pa or more to $1 \times 10^{-5}$ Pa or less is effective.

Methods of forming the organic compound layers, the anode, and the cathode to be used in the present invention are not particularly limited. An organic material can be formed into such layer by, for example, an electrolytic polymerization method, a casting method, a spin coating method, an immersion coating method, a screen printing method, a micromolding method, a microcontact method, a roll coating method, an ink-jet method, or an LB method. A vacuum vapor deposition method, a CVD method, an electron beam vapor deposition method, a resistance heating vapor deposition method, a sputtering method, or the like can also be an effective formation method depending on a material to be used. In addition, the layers and the electrodes can be patterned into desired shapes by photolithography and an etching treatment. In addition, each of soft lithography and the ink-jet method is also an effective patterning method.

The thicknesses of the organic compound layers, anode, and cathode of the present invention, which are not particularly limited, are each preferably in the range of 0.1 nm or more to 10 μm or less. Further, light is preferably extracted from at least the cathode side of the organic electroluminescence device of the present invention.

A light emitting apparatus of the present invention is characterized by including, in its surface, a plurality of organic electroluminescence devices each of which is the above-mentioned organic electroluminescence device of the present invention. The apparatus is preferably used in the information display portion of a display. The size of the display, which is not particularly limited, is preferably in the range of, for example, 1 inch to 30 inches. The number of pixels is not restricted, and, for example, a QVGA (320×240 pixels), a VGA (640×480 pixels), an XGA (1024×728 pixels), an SXGA (1280×1024 pixels), a UXGA (1600×1200 pixels), or a QXGA (2048×1536 pixels) can be adopted. In addition, the apparatus is preferably capable of displaying colors. In this case, each of a method involving independently arraying red, blue, and green light emitting devices to display colors and a method involving the use of a color filter is effective. In addition, each of a simple matrix method and an active matrix method can be effectively employed for driving the apparatus.

Hereinafter, the present invention will be described in more detail by way of examples. However, the present invention is not limited to these examples.

EXAMPLE 1

Figure 4:
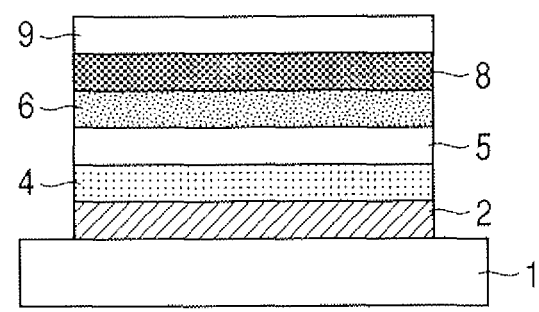
FIG. 4 is a schematic sectional view of an organic electroluminescence device to be produced in each of the examples and comparative examples of the present invention.

FIG. 4 is a schematic sectional view showing an organic electroluminescence device produced in this example.

Glass was used in the substrate 1, ITO was used in the anode 2, H-1 was used in the hole transporting layer 4, the mixture of H-1 and A-9 was used in the light emitting layer 5, E-12 was used in the electron transporting layer 6, the mixture of E-12 and cesium was used in the metal-containing organic compound layer 8, and aluminum was used in the cathode 9. A production procedure is shown below.

ITO was formed into a film having a thickness of 100 nm (anode 2) on the glass substrate 1 by a sputtering method. After that, the resultant was washed with acetone and isopropyl alcohol, and was then dried in a vacuum. After that, the surface of ITO was subjected to a UV/ozone treatment.

Next, the hole transporting layer 4, the light emitting layer 5, and the electron transporting layer 6 were continuously deposited from the vapor by using a vacuum vapor deposition apparatus under the following conditions, whereby laminated films were obtained.

Hole transporting layer 4: H-1 was formed into a film having a thickness of 80 nm at a film formation rate of 0.50 nm/sec or more to 0.52 nm/sec or less.

Light emitting layer 5: H-1 and A-9 were formed into a film having a thickness of 30 nm at a film formation rate of 0.50 nm/sec or more to 0.52 nm/sec or less and a film formation rate of 0.05 nm/sec or more to 0.07 nm/sec or less, respectively.

Electron transporting layer 6: E-12 was formed into a film having a thickness of 30 nm at a film formation rate of 0.30 nm/sec or more to 0.32 nm/sec or less.

Next, a metal cesium dispenser and E-12 were co-deposited from the vapor by resistance heating at a film formation rate of 0.04 nm/sec or more to 0.05 nm/sec or less and a film formation rate of 0.30 nm/sec or more to 0.32 nm/sec or less, respectively, whereby a film having a thickness of 30 nm (metal-containing organic compound layer 8) was formed. At this time, the co-vapor-deposition was performed at a substrate temperature of 30° C. or higher to 50° C. or lower and a degree of vacuum of $2.0 \times 10^{-6}$ Pa or more to $5.0 \times 10^{-6}$ Pa or less.

After that, aluminum was formed into a film having a thickness of 150 nm (cathode 9) at a film formation rate of 1.0 nm/sec or more to 1.2 nm/sec or less. Under a nitrogen atmosphere, the resultant device was finally sealed with a glass cap containing a moisture gettering agent, whereby an organic electroluminescence device was obtained.

Next, current efficiency upon application of a DC voltage of 7 V was measured and defined as an initial value. Next, the organic electroluminescence device was caused to emit light at room temperature continuously for 300 hours, and then current efficiency was similarly measured. In addition, the device was evaluated for its lifetime by calculating a rate of change [(the initial value of the current efficiency−a value after the continuous light emission for 300 hours)×100/the initial value of the current efficiency (%)]. The results are shown below.

| | |
|---|---|
| Initial current efficiency | 9.6 cd/A |
| Current efficiency after continuous light emission for 300 hours | 8.9 cd/A |
| Rate of change | 7.3% |

(Calculation of Coordinating Cesium Ratio)

Chromium was formed into a film having a thickness of 5 nm on a glass substrate, and then gold was formed into a film having a thickness of 50 nm on the resultant. A film was formed on the resultant under the same conditions as those of the metal-containing organic compound layer 8. The resultant film was measured by X-ray photoelectron spectroscopy (measuring device: ESCALAB 220i-XLVG/manufactured by Scientific). As a result, two kinds of peaks, that is, the peaks A and B corresponding to an N1s orbital and having binding energies of 400.2 eV and 399.0 eV, respectively, and the peak C corresponding to a Cs3d5 orbital and having a binding energy of 726.0 eV were obtained. A coordinating cesium ratio calculated from the areas of the peak B (399.0 eV) and the peak C (726.0 eV) among the peaks in accordance with the formula (I) was 0.11. In addition, a molar ratio of cesium to E-12 was 1.2.

EXAMPLE 2

An organic electroluminescence device was produced by the same approach as that of Example 1 except that the substrate temperature upon formation of the metal-containing organic compound layer 8 was set to 70° C. or higher to 100° C. or lower. Next, the device was evaluated for each of its current efficiency and lifetime by the same approach as that of Example 1. The results are shown below.

| | |
|---|---|
| Initial current efficiency | 10.5 cd/A |
| Current efficiency after continuous light emission for 300 hours | 9.6 cd/A |
| Rate of change | 8.6% |

(Calculation of Coordinating Cesium Ratio)

Chromium was formed into a film having a thickness of 5 nm on a glass substrate, and then gold was formed into a film having a thickness of 50 nm on the resultant. A film was formed on the resultant under the same conditions as those of the metal-containing organic compound layer 8. The resultant film was measured by X-ray photoelectron spectroscopy. As a result, two kinds of peaks, that is, the peaks A and B corresponding to an N1s orbital and having binding energies of 400.1 eV and 399.0 eV, respectively, and the peak C corresponding to a Cs3d5 orbital and having a binding energy of 726.0 eV were obtained. A coordinating cesium ratio calculated from the areas of the peak B (399.0 eV) and the peak C (726.0 eV) among the peaks in accordance with the formula (I) was 0.42. In addition, a molar ratio of cesium to E-12 was 1.2.

COMPARATIVE EXAMPLE 1

An organic electroluminescence device was produced by the same approach as that of Example 1 except that the degree of vacuum upon formation of the metal-containing organic compound layer 8 was set to $5.0 \times 10^{-3}$ Pa or more to $7.0 \times 10^{-3}$ Pa or less. Next, the device was evaluated for each of its current efficiency and lifetime by the same approach as that of Example 1. The results are shown below.

| | |
|---|---|
| Initial current efficiency | 4.1 cd/A |
| Current efficiency after continuous light emission for 300 hours | 3.8 cd/A |
| Rate of change | 7.3% |

(Calculation of Coordinating Cesium Ratio)

Chromium was formed into a film having a thickness of 5 nm on a glass substrate, and then gold was formed into a film having a thickness of 50 nm on the resultant. A film was formed on the resultant under the same conditions as those of the metal-containing organic compound layer 8. The resultant film was measured by X-ray photoelectron spectroscopy. As a result, two kinds of peaks, that is, the peaks A and B corresponding to an N1s orbital and having binding energies of 400.1 eV and 398.9 eV, respectively, and the peak C corresponding to a Cs3d5 orbital and having a binding energy of 726.1 eV were obtained. A coordinating cesium ratio calculated from the areas of the peak B (398.9 eV) and the peak C (726.1 eV) among the peaks in accordance with the formula (I) was 0.08. In addition, a molar ratio of cesium to E-12 was 1.2.

COMPARATIVE EXAMPLE 2

An organic electroluminescence device was produced by the same approach as that of Example 1 except that the substrate temperature upon formation of the metal-containing organic compound layer 8 was set to 150° C. or higher to 170° C. or lower. Next, the device was evaluated for each of its current efficiency and lifetime by the same approach as that of Example 1. The results are shown below.

| | |
|---|---|
| Initial current efficiency | 10.3 cd/A |
| Current efficiency after continuous light emission for 300 hours | 4.2 cd/A |
| Rate of change | 59.2% |

(Calculation of Coordinating Cesium Ratio)

Chromium was formed into a film having a thickness of 5 nm on a glass substrate, and then gold was formed into a film having a thickness of 50 nm on the resultant. A film was formed on the resultant under the same conditions as those of the metal-containing organic compound layer 8. The resultant film was measured by X-ray photoelectron spectroscopy. As a result, two kinds of peaks, that is, the peaks A and B corresponding to an N1s orbital and having binding energies of 400.1 eV and 399.0 eV, respectively, and the peak C corresponding to a Cs3d5 orbital and having a binding energy of 726.0 eV were obtained. A coordinating cesium ratio calculated from the areas of the peak B (399.0 eV) and the peak C (726.0 eV) among the peaks in accordance with the formula (I) was 0.58. In addition, a molar ratio of cesium to E-12 was 1.2.

EXAMPLE 3

FIG. 4 is a schematic sectional view showing an organic electroluminescence device produced in this example.

Glass was used in the substrate 1, chromium was used in the anode 2, H-2 was used in the hole transporting layer 4, E-1 was used in the light emitting layer 5, E-2 was used in the electron transporting layer 6, the mixture of E-1 and lithium was used in the metal-containing organic compound layer 8, and IZO was used in the cathode 9. A production procedure is shown below.

Chromium was formed into a film having a thickness of 100 nm (anode 2) on the glass substrate 1 by a sputtering method. After that, the resultant was washed with acetone and isopropyl alcohol, and was then dried in a vacuum. After that, the surface of chromium was subjected to a UV/ozone treatment.

Next, the hole transporting layer 4, the light emitting layer 5, and the electron transporting layer 6 were continuously deposited from the vapor by using a vacuum vapor deposition apparatus under the following conditions, whereby laminated films were obtained.

Hole transporting layer 4: H-2 was formed into a film having a thickness of 100 nm at a film formation rate of 0.50 nm/sec or more to 0.52 nm/sec or less.

Light emitting layer 5: E-1 was formed into a film having a thickness of 30 nm at a film formation rate of 0.50 nm/sec or more to 0.52 nm/sec or less.

Electron transporting layer 6: E-2 was formed into a film having a thickness of 20 nm at a film formation rate of 0.30 nm/sec or more to 0.32 nm/sec or less.

Next, metal lithium and E-1 were co-deposited from the vapor at a film formation rate of 0.06 nm/sec or more to 0.08 nm/sec or less and a film formation rate of 0.30 nm/sec or more to 0.32 nm/sec or less, respectively, whereby a film having a thickness of 20 nm (metal-containing organic compound layer 8) was formed. At this time, the co-vapor-deposition was performed at a substrate temperature of 30° C. or higher to 50° C. or lower and a degree of vacuum of $2.0 \times 10^{-6}$ Pa or more to $5.0 \times 10^{-6}$ Pa or less.

After that, IZO was formed into a film having a thickness of 150 nm (cathode 9) by a sputtering method. Under a nitrogen atmosphere, the resultant device was finally sealed with a glass cap containing a moisture gettering agent, whereby an organic electroluminescence device was obtained.

Next, the device was evaluated for each of its current efficiency and lifetime by the same approach as that of Example 1. The results are shown below.

| | |
|---|---|
| Initial current efficiency | 6.3 cd/A |
| Current efficiency after continuous light emission for 300 hours | 5.8 cd/A |
| Rate of change | 7.9% |

(Calculation of Coordinating Lithium Ratio)

Chromium was formed into a film having a thickness of 5 nm on a glass substrate, and then gold was formed into a film having a thickness of 50 nm on the resultant. A film was formed on the resultant under the same conditions as those of the metal-containing organic compound layer 8. The resultant film was measured by X-ray photoelectron spectroscopy. As a result, two kinds of peaks, that is, the peaks A and B corresponding to an N1s orbital and having binding energies of 402.6 eV and 401.4 eV, respectively, and the peak C corresponding to a Li1s orbital and having a binding energy of 55.8 eV were obtained. A coordinating lithium ratio calculated from the areas of the peak B (401.4 eV) and the peak C (55.8 eV) among the peaks in accordance with the formula (II) (n=2) was 0.31. In addition, a molar ratio of lithium to E-1 was 1.8.

EXAMPLE 4

An organic electroluminescence device was produced by the same approach as that of Example 3 except that the substrate temperature upon formation of the metal-containing organic compound layer 8 was set to 90° C. or higher to 120° C. or lower. Next, the device was evaluated for each of its current efficiency and lifetime by the same approach as that of Example 1. The results are shown below.

| | |
|---|---|
| Initial current efficiency | 6.5 cd/A |
| Current efficiency after continuous light emission for 300 hours | 5.6 cd/A |
| Rate of change | 13.8% |

(Calculation of Coordinating Lithium Ratio)

Chromium was formed into a film having a thickness of 5 nm on a glass substrate, and then gold was formed into a film having a thickness of 50 nm on the resultant. A film was formed on the resultant under the same conditions as those of the metal-containing organic compound layer 8. The resultant film was measured by X-ray photoelectron spectroscopy. As a result, two kinds of peaks, that is, the peaks A and B corresponding to an N1s orbital and having binding energies of 402.7 eV and 401.5 eV, respectively, and the peak C corresponding to a Li1s orbital and having a binding energy of 55.7 eV were obtained. A coordinating lithium ratio calculated from the areas of the peak B (401.5 eV) and the peak C (55.7 eV) among the peaks in accordance with the formula (II) (n=2) was 0.41. In addition, a molar ratio of lithium to E-1 was 1.8.

COMPARATIVE EXAMPLE 3

An organic electroluminescence device was produced by the same approach as that of Example 3 except that the degree of vacuum upon formation of the metal-containing organic compound layer 8 was set to $3.0\times10^{-3}$ Pa or more to $5.0\times10^{-3}$ Pa or less. Next, the device was evaluated for each of its current efficiency and lifetime by the same approach as that of Example 1. The results are shown below.

| | |
|---|---|
| Initial current efficiency | 2.9 cd/A |
| Current efficiency after continuous light emission for 300 hours | 2.3 cd/A |
| Rate of change | 20.7% |

(Calculation of Coordinating Lithium Ratio)

Chromium was formed into a film having a thickness of 5 nm on a glass substrate, and then gold was formed into a film having a thickness of 50 nm on the resultant. A film was formed on the resultant under the same conditions as those of the metal-containing organic compound layer 8. The resultant film was measured by X-ray photoelectron spectroscopy. As a result, two kinds of peaks, that is, the peaks A and B corresponding to an N1s orbital and having binding energies of 402.7 eV and 401.5 eV, respectively, and the peak C corresponding to a Li1s orbital and having a binding energy of 55.8 eV were obtained. A coordinating lithium ratio calculated from the areas of the peak B (401.5 eV) and the peak C (55.8 eV) among the peaks in accordance with the formula (II) (n=2) was 0.08. In addition, a molar ratio of lithium to E-1 was 1.8.

COMPARATIVE EXAMPLE 4

An organic electroluminescence device was produced by the same approach as that of Example 3 except that the substrate temperature upon formation of the metal-containing organic compound layer 8 was set to 150° C. or higher to 170° C. or lower. Next, the device was evaluated for each of its current efficiency and lifetime by the same approach as that of Example 1. The results are shown below.

| | |
|---|---|
| Initial current efficiency | 6.4 cd/A |
| Current efficiency after continuous light emission for 300 hours | 2.2 cd/A |
| Rate of change | 65.6% |

(Calculation of Coordinating Lithium Ratio)

Chromium was formed into a film having a thickness of 5 nm on a glass substrate, and then gold was formed into a film having a thickness of 50 nm on the resultant. A film was formed on the resultant under the same conditions as those of the metal-containing organic compound layer 8. The resultant film was measured by X-ray photoelectron spectroscopy. As a result, two kinds of peaks, that is, the peaks A and B corresponding to an N1s orbital and having binding energies of 402.7 eV and 401.5 eV, respectively, and the peak C corresponding to a Li1s orbital and having a binding energy of 55.7 eV were obtained. A coordinating lithium ratio calculated from the areas of the peak B (401.5 eV) and the peak C (55.7 eV) among the peaks in accordance with the formula (II) (n=2) was 0.68. In addition, a molar ratio of lithium to E-1 was 1.8.

EXAMPLE 5

FIG. 4 is a schematic sectional view showing an organic electroluminescence device produced in this example.

Glass was used in the substrate 1, ITO was used in the anode 2, H-9 was used in the hole transporting layer 4, the mixture of E-1 and A-3 was used in the light emitting layer 5, E-2 was used in the electron transporting layer 6, the mixture of E-2 and cesium was used in the metal-containing organic compound layer 8, and IZO was used in the cathode 9. A production procedure is shown below.

Aluminum was formed into a film to serve as a reflecting electrode on the glass substrate 1, and ITO was formed into a film having a thickness of 100 nm (anode 2) on the resultant by a sputtering method. After that, the resultant was washed with acetone and isopropyl alcohol, and was then dried in a vacuum. After that, the surface of ITO was subjected to a UV/ozone treatment.

Next, the hole transporting layer 4, the light emitting layer 5, and the electron transporting layer 6 were continuously deposited from the vapor by using a vacuum vapor deposition apparatus under the following conditions, whereby laminated films were obtained.

Hole transporting layer 4: H-9 was formed into a film having a thickness of 100 nm at a film formation rate of 0.50 nm/sec or more to 0.52 nm/sec or less.

Light emitting layer 5: E-1 was formed into a film having a thickness of 30 nm at a film formation rate of 0.50 nm/sec or more to 0.52 nm/sec or less and a film formation rate of 0.05 nm/sec or more to 0.07 nm/sec or less, respectively.

Electron transporting layer 6: E-2 was formed into a film having a thickness of 20 nm at a film formation rate of 0.30 nm/sec or more to 0.32 nm/sec or less.

Next, a cesium carbonate and E-12 were co-deposited from the vapor at a film formation rate of 0.10 nm/sec or more to 0.12 nm/sec or less and a film formation rate of 0.30 nm/sec or more to 0.32 nm/sec or less, respectively, whereby a film having a thickness of 30 nm was formed. At this time, the co-vapor-deposition was performed at a substrate temperature of 30° C. or higher to 50° C. or lower and a degree of vacuum of $1.0\times10^{-5}$ kPa or more to $3.0\times10^{-5}$ Pa or less (metal-containing organic compound layer 8).

After that, IZO was formed into a film having a thickness of 150 nm (cathode 9) by a sputtering method. Under a nitrogen atmosphere, the resultant device was finally sealed with a glass cap containing a moisture gettering agent, whereby an organic electroluminescence device was obtained.

Next, the device was evaluated for each of its current efficiency and lifetime by the same approach as that of Example 1. The results are shown below.

| | |
|---|---|
| Initial current efficiency | 11.6 cd/A |
| Current efficiency after continuous light emission for 300 hours | 10.8 cd/A |
| Rate of change | 6.9% |

(Calculation of Coordinating Cesium Ratio)

Chromium was formed into a film having a thickness of 5 nm on a glass substrate, and then gold was formed into a film having a thickness of 50 nm on the resultant. A film was formed on the resultant under the same conditions as those of the metal-containing organic compound layer 8. The resultant film was measured by X-ray photoelectron spectroscopy. As a result, two kinds of peaks, that is, the peaks A and B corresponding to an N1s orbital and having binding energies of 399.8 eV and 398.6 eV, respectively, and the peak C corresponding to a Cs3d5 orbital and having a binding energy of 726.0 eV were obtained. A coordinating cesium ratio calculated from the areas of the peak B (398.6 eV) and the peak C (726.0 eV) among the peaks in accordance with the formula (I) was 0.22. In addition, a molar ratio of cesium to E-12 was 2.8.

EXAMPLE 6

An organic electroluminescence device was produced by the same approach as that of Example 1 except that the substrate temperature upon formation of the metal-containing organic compound layer 8 was set to 70° C. or higher to 100° C. or lower. Next, the device was evaluated for each of its current efficiency and lifetime by the same approach as that of Example 1. The results are shown below.

| | |
|---|---|
| Initial current efficiency | 12.0 cd/A |
| Current efficiency after continuous light emission for 300 hours | 10.6 cd/A |
| Rate of change | 11.7% |

(Calculation of Coordinating Cesium Ratio)

Chromium was formed into a film having a thickness of 5 nm on a glass substrate, and then gold was formed into a film having a thickness of 50 nm on the resultant. A film was formed on the resultant under the same conditions as those of the metal-containing organic compound layer 8. The resultant film was measured by X-ray photoelectron spectroscopy. As a result, two kinds of peaks, that is, the peaks A and B corresponding to an N1s orbital and having binding energies of 399.7 eV and 398.6 eV, respectively, and the peak C corresponding to a Cs3d5 orbital and having a binding energy of 726.0 eV were obtained. A coordinating cesium ratio calculated from the areas of the peak B (398.6 eV) and the peak C (726.0 eV) among the peaks in accordance with the formula (I) was 0.36. In addition, a molar ratio of cesium to E-12 was 2.8.

COMPARATIVE EXAMPLE 5

An organic electroluminescence device was produced by the same approach as that of Example 1 except that the degree of vacuum upon formation of the metal-containing organic compound layer 8 was set to $5.0 \times 10^{-3}$ Pa or more to $7.0 \times 10^{-3}$ Pa or less. Next, the device was evaluated for each of its current efficiency and lifetime by the same approach as that of Example 1. The results are shown below.

| | |
|---|---|
| Initial current efficiency | 3.1 cd/A |
| Current efficiency after continuous light emission for 300 hours | 2.7 cd/A |
| Rate of change | 12.9% |

(Calculation of Coordinating Cesium Ratio)

Chromium was formed into a film having a thickness of 5 nm on a glass substrate, and then gold was formed into a film having a thickness of 50 nm on the resultant. A film was formed on the resultant under the same conditions as those of the metal-containing organic compound layer 8. The resultant film was measured by X-ray photoelectron spectroscopy. As a result, two kinds of peaks, that is, the peaks A and B corresponding to an N1s orbital and having binding energies of 399.7 eV and 398.5 eV, respectively, and the peak C corresponding to a Cs3d5 orbital and having a binding energy of 726.1 eV were obtained. A coordinating cesium ratio calculated from the areas of the peak B (398.5 eV) and the peak C (726.1 eV) among the peaks in accordance with the formula (I) was 0.07. In addition, a molar ratio of cesium to E-2 was 2.8.

COMPARATIVE EXAMPLE 6

An organic electroluminescence device was produced by the same approach as that of Example 5 except that the substrate temperature upon formation of the metal-containing organic compound layer 8 was set to 150° C. or higher to 170° C. or lower. Next, the device was evaluated for each of its current efficiency and lifetime by the same approach as that of Example 1. The results are shown below.

| | |
|---|---|
| Initial current efficiency | 11.8 cd/A |
| Current efficiency after continuous light emission for 300 hours | 4.3 cd/A |
| Rate of change | 63.6% |

(Calculation of Coordinating Cesium Ratio)

Chromium was formed into a film having a thickness of 5 nm on a glass substrate, and then gold was formed into a film having a thickness of 50 nm on the resultant. A film was formed on the resultant under the same conditions as those of the metal-containing organic compound layer 8. The resultant film was measured by X-ray photoelectron spectroscopy. As a result, two kinds of peaks, that is, the peaks A and B corresponding to an N1s orbital and having binding energies of 399.8 eV and 398.6 eV, respectively, and the peak C corresponding to a Cs3d5 orbital and having a binding energy of 726.1 eV were obtained. A coordinating cesium ratio calculated from the areas of the peak B (398.6 eV) and the peak C (726.1 eV) among the peaks in accordance with the formula (I) was 0.55. In addition, a molar ratio of cesium to E-2 was 2.8.

As is apparent from a comparison between the results of Examples 1 and 2 and the results of Comparative Examples 1 and 2, between the results of Examples 3 and 4 and the results of Comparative Examples 3 and 4, or between the results of Examples 5 and 6 and the results of Comparative Examples 5 and 6, the organic electroluminescence device of the present invention is excellent in light emitting property and lifetime.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2006-097178, filed Mar. 31, 2006, which is hereby incorporated by reference herein in its entirety.

What is claimed is:

1. An organic electroluminescence device comprising: an anode; a cathode; and an organic compound layer arranged between the anode and the cathode, wherein the organic compound layer contains a metal atom selected from the group consisting of Li, Na, K, Rb, Cs, Ca, Sr and Ba and an organic compound comprises a phenanthroline derivative, and some of said metal atom coordinates with the organic compound; and a ratio of the number of said metal atoms that are coordinated with the organic compound to the total number of the same metal atoms in the organic compound layer is 0.11 or more to 0.42 or less.

2. The organic electroluminescence device according to claim 1, wherein the ratio of the number of the metal atoms involved in the coordination to the total number of the metal atoms in the organic compound layer is 0.22 or more to 0.42 or less.

3. The organic electroluminescence device according to claim 1, wherein the molar ratio of the metal to the organic compound is from 0.5 to 3.0.

4. The organic electroluminescence device according to claim 1, wherein the organic compound comprises a low-molecular-weight compound.

5. The organic electroluminescence device according to claim 1, wherein the organic compound layer containing the metal is in electrical contact with the cathode.

6. The organic electroluminescence device according to claim 1, wherein the cathode comprises a transparent electrode.

7. The organic electroluminescence device according to claim 1, wherein light is extracted from at least a side of the cathode.

8. A light emitting apparatus comprising a plurality of organic electroluminescence devices each of which comprises the organic electroluminescence device according to claim 1.

9. The organic electroluminescence device according to claim 1, wherein the metal atom is K, Rb or Cs.

10. The organic electroluminescence device according to claim 1, further comprising a light emitting layer arranged between the anode and the organic compound layer.

11. The organic electroluminescence device according to claim 1, wherein the metal atom is Li or Cs.

* * * * *